(12) United States Patent  
Bailey (10) Patent No.: US 7,079,615 B2  
(45) Date of Patent: Jul. 18, 2006

(54) EXPANDED COMPARATOR FOR CONTROL OF DIGITAL DELAY LINES IN A DELAY LOCKED LOOP OR PHASE LOCKED LOOP

(75) Inventor: Daniel William Bailey, Northboro, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 742 days.

(21) Appl. No.: 09/988,691

(22) Filed: Nov. 20, 2001

(65) Prior Publication Data

US 2003/0099319 A1    May 29, 2003

(51) Int. Cl.
    H03D 3/24    (2006.01)
(52) U.S. Cl. ...................................................... 375/376
(58) Field of Classification Search ............... 375/294, 375/327, 355, 359, 366, 373, 376, 215, 371; 329/144, 147, 150; 327/153, 231, 278, 241, 327/279, 270, 271
    See application file for complete search history.

(56) References Cited

U.S. PATENT DOCUMENTS

| | | | | |
|---|---|---|---|---|
| 4,258,333 A | * | 3/1981 | Demuliere et al. ............ | 331/11 |
| 4,841,167 A | * | 6/1989 | Saegusa ........................ | 327/98 |
| 5,173,617 A | * | 12/1992 | Alsup et al. ................. | 327/158 |
| 5,206,889 A | * | 4/1993 | Unkrich ........................ | 377/20 |
| 5,493,243 A | * | 2/1996 | Ghoshal ...................... | 327/158 |
| 5,537,069 A | * | 7/1996 | Volk ............................. | 327/149 |
| 5,648,744 A | * | 7/1997 | Prakash et al. .............. | 331/11 |
| 5,754,606 A | * | 5/1998 | Matsuyama et al. ........ | 375/373 |
| 5,945,862 A | * | 8/1999 | Donnelly et al. ........... | 327/278 |
| 6,005,425 A | * | 12/1999 | Cho ............................. | 327/156 |
| 6,028,488 A | * | 2/2000 | Landman et al. ........... | 331/1 A |
| 6,094,082 A | * | 7/2000 | Gaudet ........................ | 327/270 |
| 6,104,228 A | * | 8/2000 | Lakshmikumar ............ | 327/407 |
| 6,137,325 A | * | 10/2000 | Miller, Jr. .................... | 327/156 |
| 6,181,168 B1 | * | 1/2001 | Zarubinsky et al. .......... | 327/12 |
| 6,281,726 B1 | * | 8/2001 | Miller, Jr. .................... | 327/156 |
| 6,351,165 B1 | * | 2/2002 | Gregorian et al. .......... | 327/156 |
| 6,380,774 B1 | * | 4/2002 | Saeki .......................... | 327/119 |
| 6,441,662 B1 | * | 8/2002 | Ikeda .......................... | 327/160 |
| 6,518,809 B1 | * | 2/2003 | Kotra .......................... | 327/175 |
| 6,606,004 B1 | * | 8/2003 | Staszewski et al. .......... | 331/17 |
| 6,683,928 B1 | * | 1/2004 | Bhullar et al. .............. | 375/374 |
| 6,693,475 B1 | * | 2/2004 | Lutkemeyer ................ | 327/161 |
| 6,727,738 B1 | * | 4/2004 | Tsukikawa ................... | 327/160 |
| 6,803,826 B1 | * | 10/2004 | Gomm et al. ................ | 331/11 |

(Continued)

OTHER PUBLICATIONS

*An All-Digital Phase-Locked Loop with 50-Cycle Lock Time Suitable for High-Performance Microprocessors*, Jim Dunning et al., IEEE Journal of Solid-State Circuits, vol. 30., No. 4, Apr. 1995 (pp. 412-422).

Primary Examiner—Emmanuel Bayard (57) ABSTRACT

A digital delay locked loop (DLL) includes a phase detector that measures the phase difference between a signal to be synchronized and a reference signal. The phase detector produces an increase or decrease signal in response to the phase difference between the two signals. This signal is received by a binary counter, which changes its count in response. The output of the binary counter is supplied to a comparator logic that implements a thermometer coding scheme. Each of the comparator output signals enables or disables a corresponding transistor stack in a delay line, thereby changing the delay of the signal propagating through the delay line.

32 Claims, 6 Drawing Sheets

U.S. PATENT DOCUMENTS

| | | | |
|---|---|---|---|
| 6,826,247 B1 * | 11/2004 | Elliott et al. | 375/376 |
| 6,901,126 B1 * | 5/2005 | Gu | 375/355 |
| 2001/0010670 A1 * | 8/2001 | Jinbo et al. | 369/47.28 |
| 2002/0033737 A1 * | 3/2002 | Staszewski et al. | 331/17 |
| 2002/0079937 A1 * | 6/2002 | Xanthopoulos | 327/158 |
| 2002/0131538 A1 * | 9/2002 | Staszewski et al. | 375/355 |

* cited by examiner

| INPUT | | | | OUTPUT | | | | | | | | | | | | | | |
|---|---|---|---|---|---|---|---|---|---|---|---|---|---|---|---|---|---|---|
| CTR3 | CTR2 | CTR1 | CTR0 | CMP1 | CMP2 | CMP3 | CMP4 | CMP5 | CMP6 | CMP7 | CMP8 | CMP9 | CMP10 | CMP11 | CMP12 | CMP13 | CMP14 | CMP15 |
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 1 | 1 | 0 | 0 | 0 | 0 | 0 | 0 | 0 | 0 | 0 | 0 | 0 | 0 | 0 | 0 |
| 0 | 0 | 1 | 0 | 1 | 1 | 0 | 0 | 0 | 0 | 0 | 0 | 0 | 0 | 0 | 0 | 0 | 0 | 0 |
| 0 | 0 | 1 | 1 | 1 | 1 | 1 | 0 | 0 | 0 | 0 | 0 | 0 | 0 | 0 | 0 | 0 | 0 | 0 |
| 0 | 1 | 0 | 0 | 1 | 1 | 1 | 1 | 0 | 0 | 0 | 0 | 0 | 0 | 0 | 0 | 0 | 0 | 0 |
| 0 | 1 | 0 | 1 | 1 | 1 | 1 | 1 | 1 | 0 | 0 | 0 | 0 | 0 | 0 | 0 | 0 | 0 | 0 |
| 0 | 1 | 1 | 0 | 1 | 1 | 1 | 1 | 1 | 1 | 0 | 0 | 0 | 0 | 0 | 0 | 0 | 0 | 0 |
| 0 | 1 | 1 | 1 | 1 | 1 | 1 | 1 | 1 | 1 | 1 | 0 | 0 | 0 | 0 | 0 | 0 | 0 | 0 |
| 1 | 0 | 0 | 0 | 1 | 1 | 1 | 1 | 1 | 1 | 1 | 1 | 0 | 0 | 0 | 0 | 0 | 0 | 0 |
| 1 | 0 | 0 | 1 | 1 | 1 | 1 | 1 | 1 | 1 | 1 | 1 | 1 | 0 | 0 | 0 | 0 | 0 | 0 |
| 1 | 0 | 1 | 0 | 1 | 1 | 1 | 1 | 1 | 1 | 1 | 1 | 1 | 1 | 0 | 0 | 0 | 0 | 0 |
| 1 | 0 | 1 | 1 | 1 | 1 | 1 | 1 | 1 | 1 | 1 | 1 | 1 | 1 | 1 | 0 | 0 | 0 | 0 |
| 1 | 1 | 0 | 0 | 1 | 1 | 1 | 1 | 1 | 1 | 1 | 1 | 1 | 1 | 1 | 1 | 0 | 0 | 0 |
| 1 | 1 | 0 | 1 | 1 | 1 | 1 | 1 | 1 | 1 | 1 | 1 | 1 | 1 | 1 | 1 | 1 | 0 | 0 |
| 1 | 1 | 1 | 0 | 1 | 1 | 1 | 1 | 1 | 1 | 1 | 1 | 1 | 1 | 1 | 1 | 1 | 1 | 0 |
| 1 | 1 | 1 | 1 | 1 | 1 | 1 | 1 | 1 | 1 | 1 | 1 | 1 | 1 | 1 | 1 | 1 | 1 | 1 |

FIG.6

EXPANDED COMPARATOR FOR CONTROL OF DIGITAL DELAY LINES IN A DELAY LOCKED LOOP OR PHASE LOCKED LOOP

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to the generation and synchronization of clock signals in a system. More particularly, the present invention relates to delay locked loop or a phase locked loop implemented with digital circuitry. Still more particularly, the present invention relates to a digitally-designed delay locked loop that produces a linear delay line gain.

2. Background of the Invention

Delay locked loops (DLLs) and phase locked loops (PLLs) are commonly used in electrical system to synchronize a signal with a clock signal. For example, in a synchronous circuit, a DLL may be used to synchronize a data output signal with a clock signal output. Thus, one typical implementation of a DLL is to delay the transmission of the data output signal to coincide with an edge of a clock signal. The ability of the receiving device to properly interpret the data output signal depends, at least in part, on the ability of the DLL to make the data output available within tightly controlled time periods relative to the clock signal. If the data output signal is not delayed for a sufficient time interval, the data output signal may be delivered prematurely, prior to the time when the receiving device is expecting the data (based on predefined timing protocols). This can also lead to the receiving device misinterpreting the data output signal. The ability of the DLL to operate within very tightly defined tolerances is critical to successful operation of many electrical systems.

Traditionally, delay locked loops have been implemented as analog circuits, despite the fact that many DLLs are used in digital circuit designs, such as computer systems and other microprocessor-based designs. Analog circuits have been selected because of the familiarity of system designers with analog designs, the ability to infinitely adjust the delay loop, and the simplicity of the implementation. Although less common than analog designs, digital DLLs offer the potential for certain improvements over existing analog designs. In particular, digital DLLs have the capability of improving run time, providing programmable control, scaling more readily to new technology processes, being less reliant on the characterization of discrete circuit elements such as resistors and capacitors, and providing greater noise immunity. Despite these potential advantages, system designers have proven hesitant to use digital DLLs due to performance concerns. One specific concern is whether tracking is well-behaved and monotonic. If the delay times through different delay lines has non-linear anomalies, the effects of jitter (which is the variation of the delay through the delay lines caused by noise) may be unacceptable.

In conventional digital DLLs and/or PLLs, a phase detector increments or decrements a binary counter to indicate the difference (or the misalignment) in phase between a synchronizing signal and a clock signal. See e.g., Jim Dunning, "An All-Digital Phase-Locked Loop with 50-Cycle Lock Time Suitable for High-Performance Microprocessors," *IEEE Journal of Solid-State Circuits*, Vol. 30, No. 4 (April 1995). The phase comparator thus indicates whether the feedback signal is before or after the reference signal, and transmits a signal to the binary counter to speed up or slow down the feedback signal. The digital output of the binary counter then is used to control the amount of delay to be added to the synchronizing signal to align it with the clock signal. One typical technique is to couple the output signal from the binary counter to a digital-to-analog converter, thus producing an analog signal corresponding to the desired delay period. The analog signal then is used to control the delay line. Alternatively, the binary counter may be coupled directly to delay lines, with each output terminal of the binary counter connected to (or enabling) a delay line. Thus, for example, multiple delay lines may be constructed with a different number of inverters, and the binary counter output bits may then be used to select which of the delay lines is used to delay the data output signal. Alternatively, parallel capacitor loads may be used instead of inverter delay elements.

While both of these approaches have met with some limited success, neither approach has been effective in eliminating concerns about the performance of digital delay locked loops. With respect to the first approach, the use of a digital-to-analog converter introduces analog issues into the design, thereby eliminating many of the advantages of a purely digital design. The second approach, while achieving some of the advantages of a purely digital design, requires very careful design and characterization of the delay lines. One particular concern is that the phase error will depend on the counter value, if the delay line gain from line-to-line is not monotonic. This effect is particularly of concern as the counter changes multiple output bits. For example, as the counter increments from a delay value of 31 to 32, five "1s" must change to a single "1" followed by five "0s" (011111 transitions to 100000). Thus, before the transition, five legs of the delay element are enabled, and afterwards, a single delay element leg is enabled, which must exceed the combined delay effect of the other five delay element legs. It can be extremely difficult to design the delay element legs to insure a monotonic or constant time delay value for each count of the counter. Unless carefully designed, the combination of delay element legs may exhibit some degree of non-linearity, which reduces the ability of the DLL to synchronize to the master clock with any degree of precision.

It would be advantageous if a digital DLL could be developed with enhanced performance. In particular, it would be desirable if a DLL was designed that exhibited monotonic or constant delay gain in response to an increase in the binary counter value. The ability to achieve a linear tracking of the binary counter value to the amount of delay introduced, would greatly enhance the performance of digital DLLs, and would lead to a greater acceptance of such designs.

BRIEF SUMMARY OF THE INVENTION

The present invention solves the deficiencies of the prior art by designing a digital delay locked loop or phase locked loop that produces a more linear delay performance through the use of a binary counter coupled to a comparator logic. A phase detector determines the difference in phase between a reference signal and a feedback signal, and generates a signal that indicates if the amount of delay needs to be incremented or decremented to more closely track the reference signal. The phase detector output couples to a binary counter, which increases or decreases its value based on the increment or decrement signal. The binary counter produces an output indicative of its count value, preferably on multiple output lines using a binary code. Thus, for example, a four bit counter might be capable of representing sixteen ($2^4$=16) different count values representing sixteen discrete delay values. The comparator logic couples to the binary counter to receive the count value, and in response produces a thermometer-coded output that enables particular delay line elements that cause the signal to be synchronized to be delayed by incremental values.

According to one embodiment, the output signal representing the counter value is supplied to a partial comparator, which establishes threshold values for the counter value. These threshold values are in turn supplied to an expanded comparator, which produces multiple comparator output signals. The comparator output signals operate to enable an associated delay element, thereby controlling the speed with which the clock signal propagates through the delay line element. The expanded comparator preferably comprises a plurality of identical logical units, with a particular logic unit associated with each comparator output. The logic units couple to different threshold values from the partial comparator to define the state of each of the comparator outputs. The delay line preferably comprises a plurality of parallel transistor stacks that are selectively enabled by the output signals from the logical units in the expanded comparator. As each transistor stack is enabled, the speed with which the clock signal propagates through the delay line increases. Each of the transistor stacks preferably has different size transistors to provide a constant delay through each stack.

These and other aspects of the present invention will become apparent upon analyzing the drawings, detailed description and claims, which follow.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections. The term "asserted" refers to a transition of a signal line from its false or inactive state to its true or active state. The true or active state may be either a high or low voltage state. Similarly, the term "de-asserted" refers to a transition of a signal line from its true or active state to its false or inactive state. The false or inactive state may be either a high or a low voltage state. The term "stack" or "transistor stack" refers to two or more transistors that are arranged in a series orientation. To the extent that any term is not specially defined in this specification, the intent is that the term is to be given its plain and ordinary meaning.

DETAILED DESCRIPTION OF THE PREFERRED EMBODIMENTS

In the following discussion, a digital delay locked loop is discussed in accordance with the preferred embodiment. One skilled in the art will understand that this disclosure also may be applied to phase locked loops (PLLs). The primary difference between DLLs and PLLs relates to the manner in which they produce their respective outputs. A DLL typically delays the transmission of a signal by implementing a delay line through which the signal propagates. A PLL typically includes a voltage controlled frequency that operates in conjunction with a phase comparator to track the frequency and phase of the incoming signal.

Figure 1:
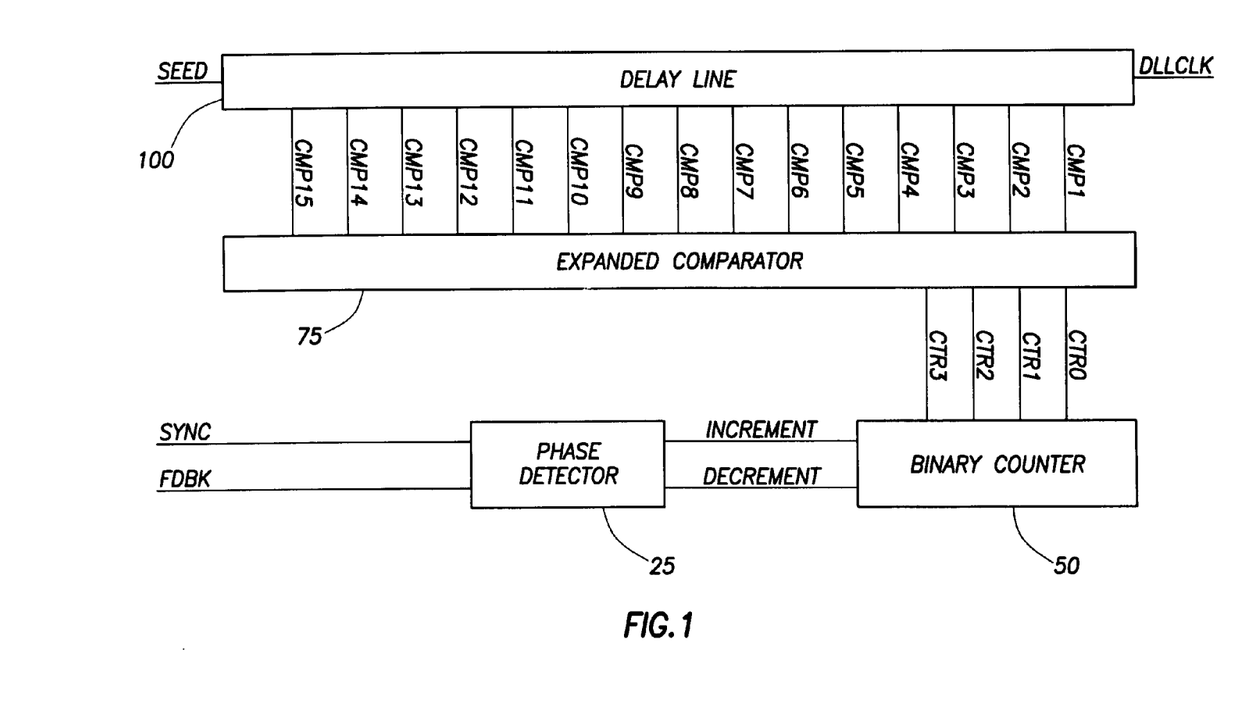
FIG. 1 is a block diagram illustrating an exemplary digital delay locked loop generally constructed according to the principles of the present invention.

The general principles of the present invention will now be described with reference to FIG. 1. A Delay Locked Loop (DLL) constructed in accordance with the preferred embodiment generally includes a phase detector 25, a binary counter 50, an expanded comparator 75, and a delay line 100. The phase detector 25 compares an external reference signal (or clock) with a signal to be synchronized with the reference signal to determine the degree or amount of misalignment between these two signals. In the preferred embodiment of FIG. 1, the two clock signals to be synchronized are a feedback clock signal, and a synchronizing clock signal. The feedback clock signal represents the delayed clock signal produced as the output of the Delay Locked Loop (or may represent some signal derived from the output signal of the Delay Locked Loop). The synchronizing clock is the signal which the DLL is using as a reference to synchronize the feedback clock signal The phase detector 25 then generates an output signal that seeks to synchronize the clock signal with the reference signal. In FIG. 1, the phase detector is shown as generating two output signals, one of which is an increment signal, the other of which is a decrement signal. As one skilled in the art will appreciate, the number of output lines between the phase detector and binary counter 50 may be varied as desired using various coding techniques. The increment and decrement signals are used to adjust the value of the binary counter 50 to thereby align the external reference signal with the clocked signal that is to be synchronized to the external reference signal.

The binary counter 50 receives the increment/decrement signals from the phase detector 25 and modifies its count value. The count value of the binary counter 50 may change in a lock-step manner, or may use more complex algorithms to change its value based on the magnitude of the increment and decrement signals. The binary counter then produces an output signal indicative of its new count value. The output signal preferably comprises a plurality of output lines, as shown by the four output lines (CTR0, CTR1, CTR2, CTR3) depicted in FIG. 1. The number of output lines x provides m possible delay values ($2^x$=m). Thus, if the binary counter has four output lines, sixteen different delay values can be decoded, as one skilled in the art will understand.

The output signal lines of the binary counter 50 couple to the input terminals of the expanded comparator 75. In response, the comparator 75 generates a plurality of output signals, which control an associated delay element in delay line 100. The comparator 75 preferably generates m output lines (or m−1 output lines, if one of the output states represents a zero delay), where m represents the different possible delay values, as described above. Thus, as shown in FIG. 1, the expanded comparator 75 includes 16 different delay output lines (CMP[1–15]), indicating the sixteen different delay values that may be decoded from the four output lines of the binary counter 50. Fewer number of output lines may be provided, if desired.

Figure 6:
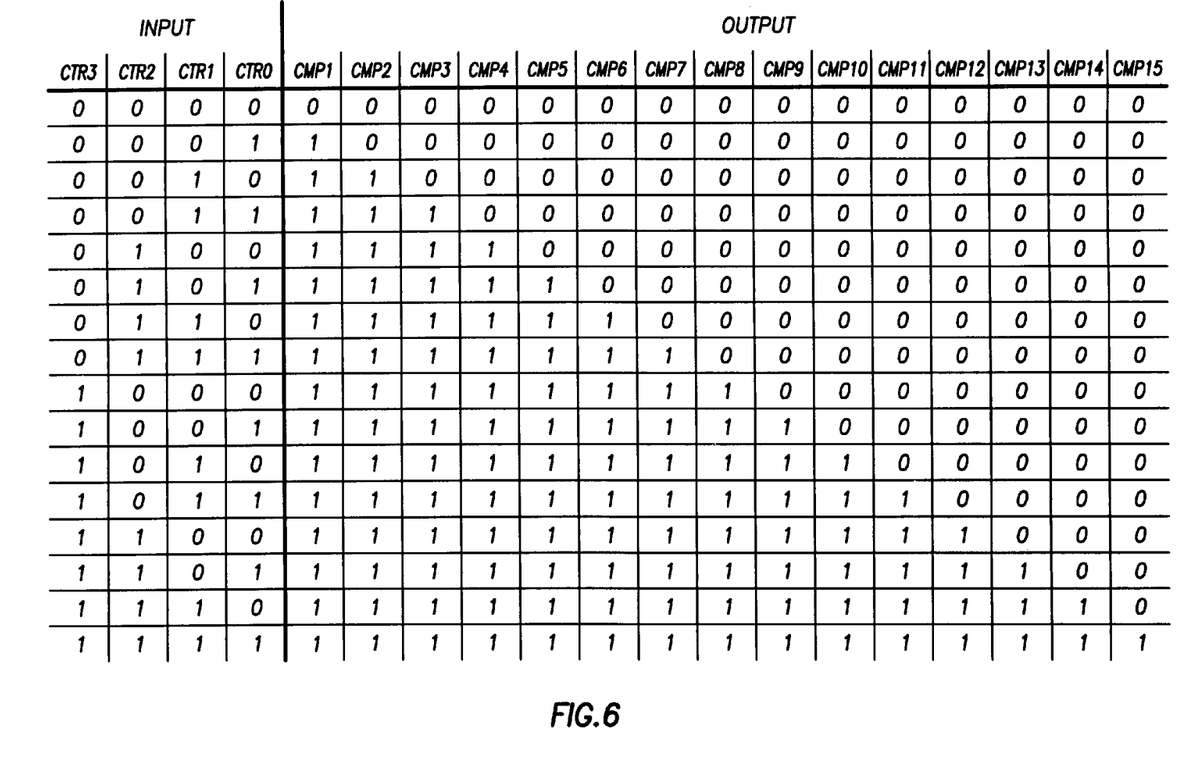
FIG. 6 is a truth table illustrating the operation of the expanded comparator of FIG. 1.

The expanded comparator 75 preferably implements a thermometer coding scheme, as shown in the Truth Table of FIG. 6. In FIG. 6, each of the possible binary counter values are shown, ranging from 0000 for CTR[(0–3] to 1111. The counter values (or signal lines) provide the input to the expanded comparator. The different binary counter output values produce the values on the output signal lines (CMP [1–15])of the expanded comparator. Thus, an input value of 0100, will produce a high logic level signal on CMP1, CMP2, CMP3 and CMP4, while CMP[5–15] remain low. Described differently, an input value of 4 (which is binarily coded) causes four of the comparator output lines to be asserted. With proper sizing of the delay line, it is possible to produce a digital DLL that exhibits a more linear gain with respect to the counter value using the thermometer coding technique with the expanded comparator.

The delay line 100 preferably includes a plurality of delay elements, which may be configured in parallel to permit delay elements to be added or removed from the delay path. Preferably, each of the output signal lines from the expanded comparator 75 controls or enables one or more associated delay elements in delay line 100. The output signal emanating from the delay line is the delay locked loop clock signal (DLLCLK), which preferably is used as the source for the clock tree in a digital circuit. The delay line output may also be used in a variety of other ways, and may be used to represent a delayed data output signal. The input signal to the delay line 100 is an early clock signal (SEED), which represents the nominal delay line delay of the clock signal (or the source clock).

Figure 2:
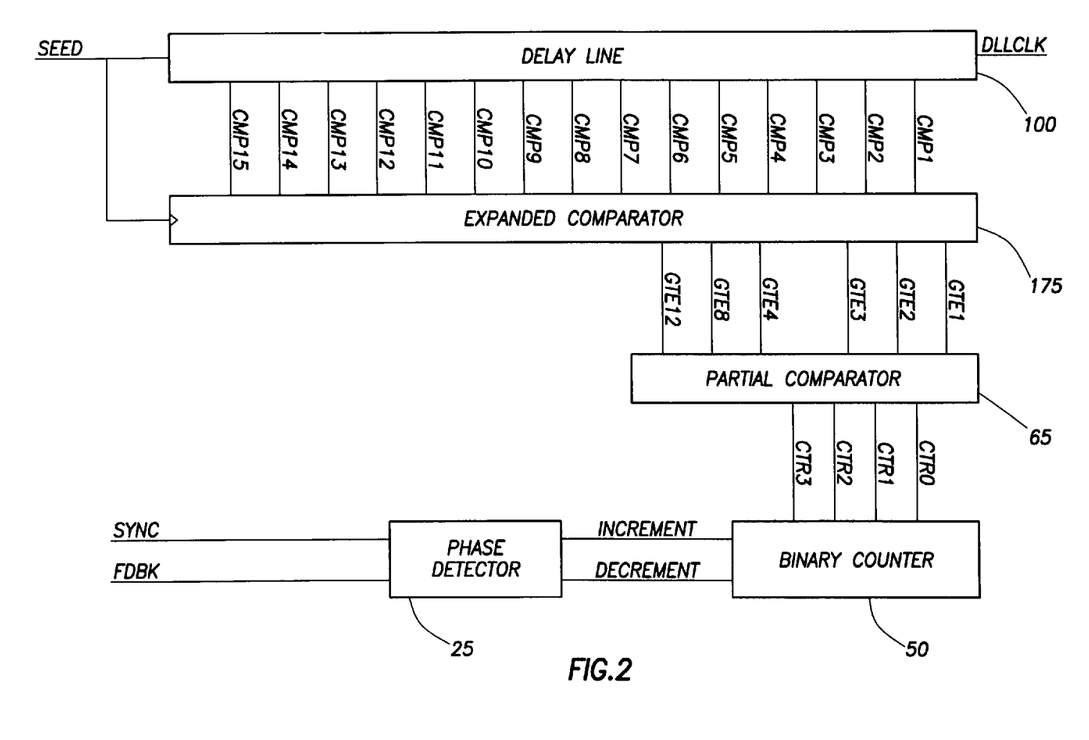
FIG. 2 is a block diagram of a digital delay locked loop constructed in accordance with the preferred embodiment.

Referring now to FIG. 2, a DLL constructed in accordance with the preferred implementation includes a partial comparator 65 that operates in conjunction with expanded comparator 175 to produce the comparator output signals CMP [1–15]. Although shown as two separate comparators, partial comparator 65 and expanded comparator 175 may be implemented in a single structure. Comparators 65 and 175 work in conjunction to produce the thermometer code of FIG. 6 directly from the binary counter output lines. The phase detector 25, binary counter 50, and delay line element 100 have been identified by the same reference numerals as in FIG. 1 to reflect the intent that these devices would be configured and would operate identically to the corresponding devices in FIG. 1.

As shown in FIG. 2, partial comparator 65 preferably receives the output signals CTR[0-x] from binary counter 50, indicating the status value of the count in the counter 50. In FIG. 2, four such output lines are depicted for purposes of illustration as CTR[0–3]. Thus, partial comparator 65 receives the count value on the CTR output lines representing the count in binary counter. In response, the partial comparator 65 performs a comparison of the count value represented by output lines CTR[0-x] to determine range values, which then can be used to develop the thermometer code values of FIG. 6. Thus, as shown in the exemplary embodiment of FIG. 2 where four binary counter output lines are provided to represent sixteen different count values, the partial comparator 65 produces six different outputs. The six output signals shown in FIG. 2 include a greater than or equal to one (GTE1) output signal, a greater than or equal to two (GTE2) output signal, a greater than or equal to three (GTE3) output signal, a greater than or equal to four (GTE4) output signal, a greater than or equal to eight (GTE8) output signal, and a greater than or equal to twelve (GTE12) output signal. From these six output signals, each of the thermometer codes for CMP[1–15] can readily be generated. Thus, expanded comparator 175 receives the output signal lines from the partial comparator, and from those signals, generates output signals CMP[1–15], in accordance with the truth table of FIG. 6.

Figure 5:
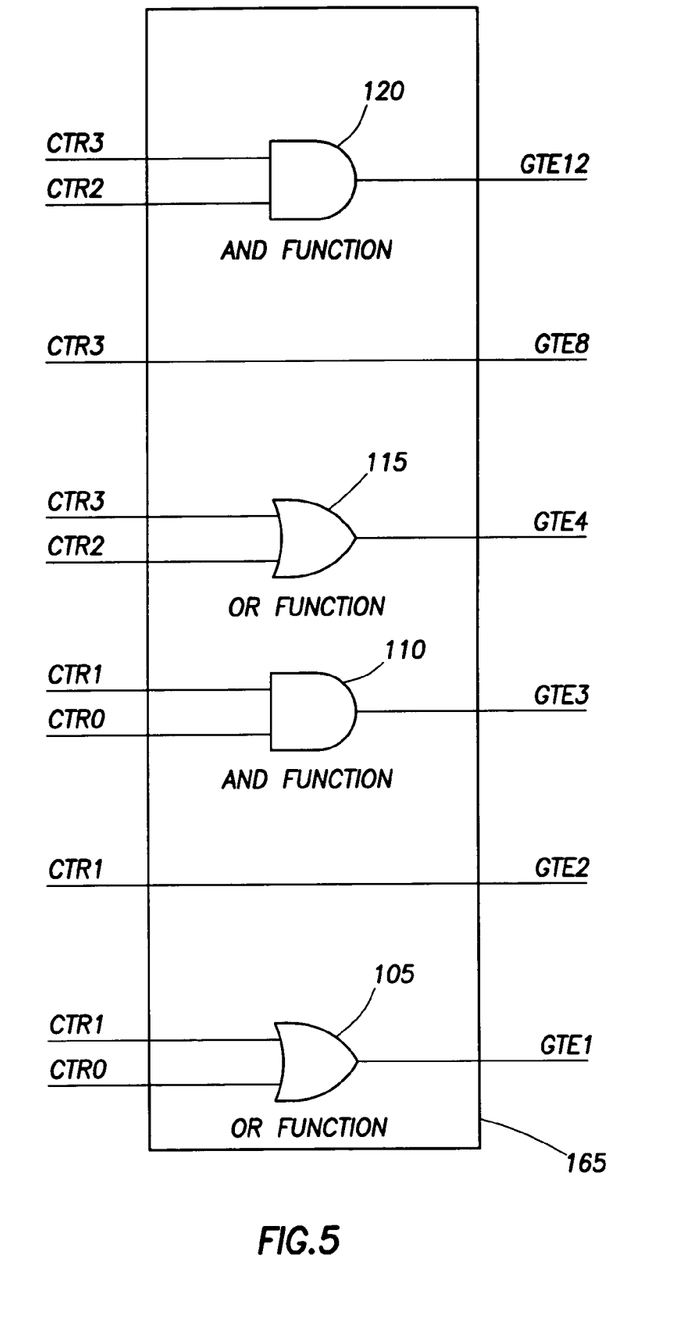
FIG. 5 is a circuit schematic illustrating the partial comparator of FIG. 2.

Referring now to FIG. 5, the preferred construction of the partial comparator 65 will now be described in more detail. The following discussion assumes that a four bit binary counter is implemented, with the understanding that other binary counters may be used with suitable modification of the partial comparator. According to the preferred embodiment, each of the output lines of the partial comparator 65 is derived using simple combinatorial logic devices. Thus, as shown in FIG. 5, the GTE1 signal line is derived by OR'ing together counter output values CTR[0] and CTR[1] in OR gate 105. Thus, the GTE1 signal line will be asserted if either CTR [0] or CTR[1] is asserted. The GTE2 value preferably is derived directly from the state of the CTR[1] output line from counter 50, and thus GTE2 tracks the state of the CTR[1] output line. The GTE3 output signal preferably is obtained by combining together the CTR[0] and CTR[1] output lines in AND gate 110. Thus, GTE3 only is asserted if both CTR[0] and CTR[1] are asserted. The GTE4 output signal from partial comparator 65 preferably derives from OR'ing together CTR[2] and CTR[3] counter output signals in OR gate 115. Thus, GTE4 is asserted if either CTR[2] or CTR[3] are asserted. The GTE8 value preferably is derived directly from the state of the CTR[3] output line from counter 50, and thus GTE8 tracks the state of the CTR[3] output line. The GTE 12 output signal preferably is obtained by combining together the CTR[2] and CTR[3] output lines in AND gate 120. Thus, GTE12 only is asserted if both CTR[2] and CTR[3] are asserted.

Figure 4:
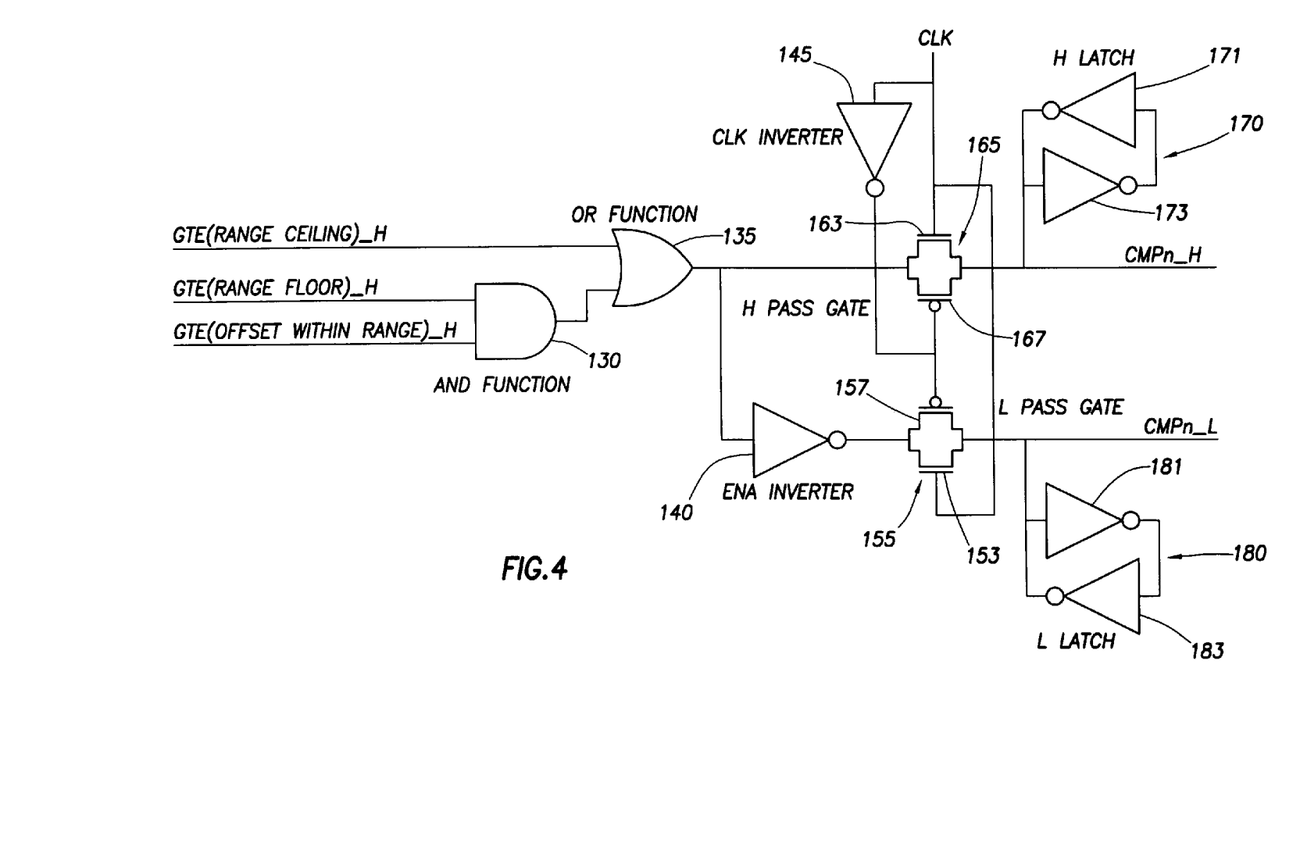
FIG. 4 is a circuit schematic depicting the expanded comparator constructed in accordance with the preferred embodiment of FIG. 2.

Referring now to FIG. 4, the expanded comparator preferably includes m logical units, where as noted, m reflects the total number of CMP output signals provided by the expanded comparator 175. According to the preferred embodiment, each of the m logical units is constructed identically for the sake of simplicity in fabrication. One of the m logical units is depicted in FIG. 4. Thus, according to the preferred embodiment, a logic circuit similar to that shown in FIG. 4 is provided for each CMP output signal. In accordance with the preferred embodiment, a high and a low CMP output signal is derived from the output signal lines of the partial comparator. These high and low CMP output signals are referenced in FIG. 4 as CMPn_H and CMPn_L. Thus, CMP5 in FIG. 2, for example, would actually comprise a CMP5_H and CPM5_L signal, where CMP5_H would be a binary 1, and CMP5_L would be a binary 0, if CMP5 was asserted. The notation CMPn_H therefore refers to the high output signal for the nth CMP signal, while CMPn_L refers to the low output signal for the nth CMP signal. If m CMP signals are generated by the expanded comparator 175, then the variable n indicates one of the m signals.

Each of the logical units of the expanded comparator 175 preferably includes a NAND gate 130, OR gate 135, a high pass gate 165, a low pass gate 155, a high data latch 170 and a low data latch 180. According to the preferred embodiment, three of the signals from the partial comparator 65 are provided to each of the logical units, although in some instances fewer signals may be provided, as will be apparent from the following discussion. The three input signals are referred to as GTE(range ceiling)_H, GTE(range floor)_H, and GTE(offset within range)_H. Referring again to FIG. 2, it will be recalled that the six output signals from the partial comparator are GTE1, GTE2, GTE3, GTE4, GTE8, and GTE12. Each of these output lines represents a range value or threshold value for the counter outputs. Thus, if the counter output on CTR[0–3] is 1010 (in the binary number system), this would represent a count value of 10 (in the decimal number system) according to normal convention. The upper range value for this count would be GTE12 (greater than equal to 12), and the lower range would be GTE8 (greater than equal to 8). Thus, a count of 1010 (binary) would be bounded by the range values GTE8 and GTE12.

Referring again to FIG. 4, the GTE(range ceiling)_H represents the output signal from the partial comparator that defines the upper range for the nth CMP output line. The GTE(range floor)_H represents the output signal from the partial comparator that defines the lower range for the nth CMP output line. The final input signal, the GTE(offset within range)_H represents the difference between the nth CMP output line, and the GTE(range floor)_H. A few examples will illustrate how the input signals are selected for connection to each of the m logical units. If 15 different CMP output signals are provided, as shown in FIGS. 2 and 6, then m=15. Thus, 15 logical units preferably would be provided to generate the 15 different CMP signals. The input signals for logical units for CMP11, CMP3, and CMP14 will now be discussed as representative examples to illustrate the manner in which the input signals are selected for each of the logical units. For the logical unit that generates CMP11 (n=11), the output signal from partial comparator that is selected as the GTE(range ceiling)_H will be GTE12. GTE12 is selected because it is the threshold value from the partial comparator that is just above the n value. The GTE(range floor)_H would be GTE8, because this is the threshold value that is just below the n value. The GTE (offset within range)_H would be GTE3, because the difference between the n value and the GTE(range floor)_H is 3 (11−8=3).

For CMP3 (n=3), the GTE(range ceiling)_H would be selected as GTE3. The other input signals would be GTE2 for the floor, and GTE1 for the offset (although the floor and offset could be left unconnected because the ceiling represents the n value). For CMP14 (n=14), the GTE(range ceiling)_H input would be left unconnected, since there is no ceiling output value for n=14. The GTE(range floor)_H would connect to GTE12, and the offset would be GTE2. An exemplary table for the different CMP n values is provided:

| N | GTE (range ceiling)_H | GTE (range floor)_H | GTE (offset within range)_H |
|---|---|---|---|
| 1 | GTE1 | X | X |
| 2 | GTE 2 | X | X |
| 3 | GTE 3 | X | X |
| 4 | GTE 4 | X | X |
| 5 | GTE 8 | GTE 4 | GTE 1 |
| 6 | GTE 8 | GTE 4 | GTE 2 |
| 7 | GTE 8 | GTE 4 | GTE 3 |
| 8 | GTE 8 | X | X |
| 9 | GTE 12 | GTE 8 | GTE 1 |
| 10 | GTE 12 | GTE 8 | GTE 2 |
| 11 | GTE 12 | GTE 8 | GTE 3 |
| 12 | GTE 12 | X | X |
| 13 | X | GTE 12 | GTE 1 |
| 14 | X | GTE 12 | GTE 2 |
| 15 | X | GTE 12 | GTE 3 |

Where X represent a no connection.

Referring still to FIG. 4, the input signals GTE(range floor)_H and GTE(offset within range)_H preferably connect to the input terminals of AND gate 130. The output terminal of NAND gate 130, and the input signal GTErange ceiling)_H preferably connect to the input terminals of OR gate 135. The output terminal of OR gate 135 preferably couples to the high pass gate 165 and to the low pass gate 155. With respect to the high pass gate 165, the output terminal of OR gate 135 connects to the source terminal of transistor 163 and transistor 167, which in conjunction comprise the high pass gate 165. The gate of transistor 163 is driven by a clock signal (CLK), while the gate of transistor 167 is driven by an inverted version of the clock signal. The inverted clock signal is produced by inverter 145. With respect to the low pass gate 155, the output terminal of OR gate 135 is inverted by inverter 140. The inverted output of OR gate 135 connects to the source terminals of transistor 153 and 157, which in conjunction comprise the low pass gate 155. Transistor 153 is gated by the clock signal (CLK), while the gate of transistor 157 connects to the output of inverter 145.

The drain terminals of transistors 163, 167 comprise the CMPn_H output terminal. The data present on the CMPn_H output terminal preferably is latched by the high data latch 170. The high data latch 170 preferably comprises a pair of inverters 171, 173 constructed in conventional fashion as a data latch. As shown in FIG. 4, the output terminal of inverter 173 connects to the input terminal of inverter 171. The output terminal of inverter 171 connects to the input terminal of inverter 173. In this fashion, the state value at the drain of transistors is reinforced and maintained in latch 170. Similarly, the drain terminals of transistors 153, 157 comprise the CMPn_L output terminal. This value preferably is latched by the low data latch 180. The low data latch 180 preferably comprises a pair of inverters 181, 183 constructed in conventional fashion as a data latch. As shown in FIG. 4, the output terminal of inverter 183 connects to the input terminal of inverter 181. The output terminal of inverter 181 connects to the input terminal of inverter 183. The net effect of the configuration shown in FIG. 4 is that the output of OR gate 135 will be driven strongly by the high pass gate 165 when the clock signal (CLK) is high, and appear at the CMPn_H output terminal. Similarly, the inverted state of the OR gate output signal will be driven strongly by the low pass gate 155. The output of the OR gate 135 will be asserted when the count value is equal to n, where n represents the particular logical unit that produces CMPn_H and CMPn_L.

Thus, if the logical unit generates CMP5, then OR gate 135 will be asserted high when the count is 5 in the counter 50. This will cause the partial comparator to assert GTE1, GTE2, GTE3, GTE4, and de-assert GTE8 and GTE12. Because GTE4 and GTE1 are asserted, the output of AND gate 130 will be asserted, which will cause OR gate 135 to assert. This will cause CMP5_H to go high (i.e., produce a "1" output) and CMP5_L to go low (i.e., produce a "0" output) when the clock signal is high.

Figure 3:
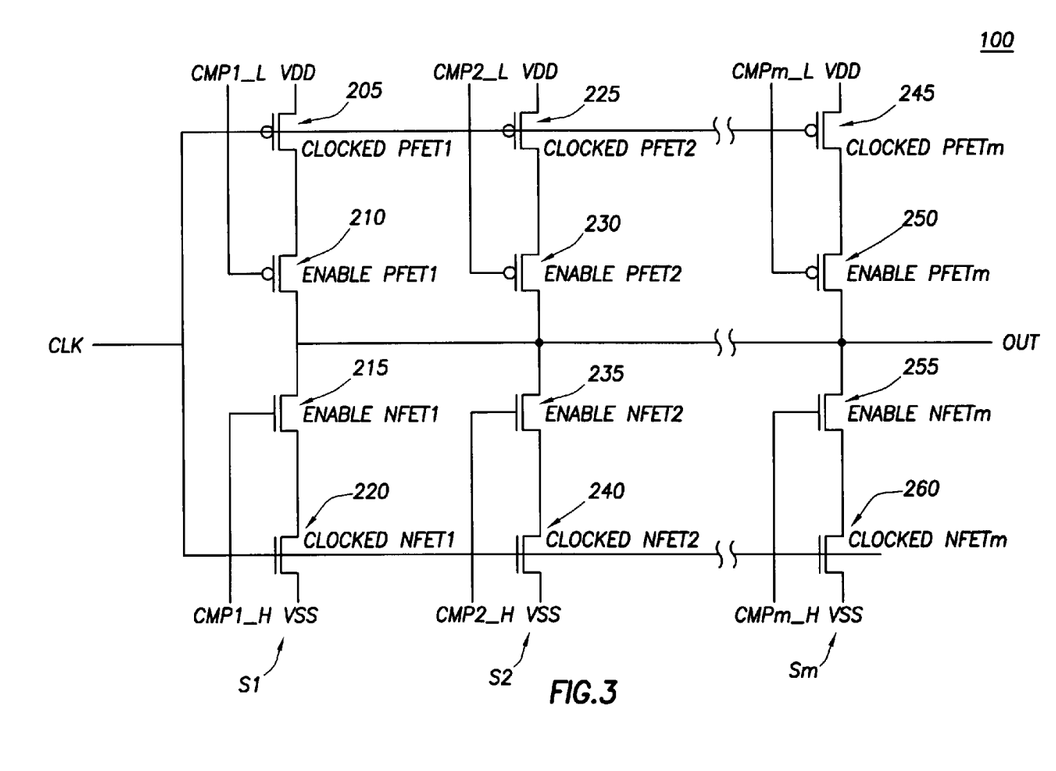
FIG. 3 is a circuit schematic partially illustrating the delay line in accordance with the preferred embodiment of FIG. 2.

Referring now to FIG. 3, the delay line 100 (FIG. 2) will now be described in additional detail. In accordance with the preferred embodiment, delay line 100 preferably comprises a plurality of transistor stacks S that are configured in parallel. Three such transistor stacks S1, S2, Sm are shown in FIG. 3, with the understanding that m transistor stacks are provided. Thus, each of the CMP output lines from extended comparator 175 has an associated transistor stack. According to the preferred embodiment, each CMP output line functions as the enable signal for a particular transistor stack. Thus, CMP1 operates as the enable signal for transistor stack S1, and CMP 2 operates as the enable signal for transistor stack S2. Each of the other transistor stacks not shown are configured in identical fashion to be enabled by the associated CMP output line.

As shown in FIG. 3, each of the transistor stacks are similarly configured. Thus, each of the stacks includes a clocked p-junction field effect transistor (PFET), an enable PFET, a clocked n-junction field effect transistor (NFET), and an enable PFET. Thus, referring to stack S2, a clocked PFET 225 has a source terminal connected to the voltage supply $V_{DD}$, and a gate connected to the SEED clock (CLK). The drain of clocked PFET 225 connects to the source of enable PFET 230. The drain of enable PFET 230 connects to the output terminal (which is the same as the DDLCLK of FIG. 2). The gate of enable PFET 230 preferably connects to the CMP2_L output signal from the expanded comparator 175. In similar fashion, the source of clocked NFET 240 connects to ground ($V_{SS}$), while the gate of clocked NFET 240 connects to the CLK terminal. The drain of clocked NFET 240 connects to the source terminal of enable NFET 235. The drain terminal of enable NFET 235 connects in turn to the output terminal, while the gate terminal connects to CMP2_H. When CMP2_H is asserted high, and CMP2_L goes low, each of the enable transistor gates 230, 235 conduct.

The first transistor stack S1 driving an inverted form of the clock signal (CLK) on the output (OUT) terminal when CMP1 is asserted. Each of the other transistor stacks reinforces the output of the first transistor stack S1, without changing the output of the clock signal. As additional transistor stacks are turned on in parallel with S1 (by having more CMP output signals asserted), the delay line becomes faster, and thus the delay exhibited at the output terminal decreases. If all transistor stacks are enabled, the delay through delay line 100 will be at a minimum value (as more charge is driven through the parallel stack of transistor gates). Thus, delay line 100 is a gate with a variable trans-conductance, that is controlled by the CMP[1–15] output lines from the expanded comparator 175.

According to the preferred embodiment, the transistor gates of each stack are sized differently. Thus, for example, the size of the transistors in stack S1 is different than the size of transistors in stack S2. The delay through the delay line is non-linear with respect to the size (width) of the transistors. This variance in transistor size between stacks is preferred to reflect the difference in the input values that appear at each stack. The stack size variance thus permits the delay to remain constant as additional transistor stacks are enabled or disabled.

As noted, above, the present invention may be extended to a PLL. Thus, for example, a PLL may be constructed through a ring of inverters. The speed at which the signal travels through the inverter ring is controlled by the voltage applied to the inverters. The higher the voltage, the faster the clock signal will be transmitted. The principles of the present invention may be applied to such a PLL in several ways. One possible technique would be to have the expanded comparator of the present invention control the voltage level supplied to an inverter ring. Thus, in this example, the delay line would control voltage level of the output signal.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

I claim:

1. A locked loop system that synchronizes a clocked signal to a reference clock signal, comprising:
   a phase detector that detects a difference in phase between the clocked signal and the reference clock signal, and generates an output signal indicating the phase difference;
   a digital counter coupled to the phase detector and having a count value, said digital counter receiving the output signal generated by the phase detector, and in response, modifying said count value and generating a binary output signal indicating said count value;
   an electronic circuit coupled to said digital counter, said electronic circuit being configured to receive said binary output signal, and in response, generate a thermometer-coded output signal that corresponds to said binary output signal; and
   a delay line coupled to said electronic circuit, said delay line including a plurality of delay elements that are enabled by said thermometer-coded output signal;
   wherein said electronic circuit comprises comparator logic including a first comparator and a second comparator, and wherein said first comparator receives said binary output signal from said digital counter, and in response generates multiple threshold values.

2. A system as in claim 1, wherein the digital locked loop system comprises a delay locked loop.

3. A system as in claim 1, wherein the digital locked loop system comprises a digital phase locked loop.

4. A system as in claim 1, wherein the clocked signal comprises a feedback clock generated by said delay line, and the reference clock signal comprises a synchronized clock signal.

5. A system as in claim 2, wherein the output signal generated by the phase detector includes an increment count signal and a decrement clock signal, depending on if the clocked signal lags or leads the reference clock signal.

6. A system as in claim 5, wherein the digital counter increases its count value in response to the increment count signal, and decreases its count value in response to the decrement clock signal.

7. A system as in claim 6, wherein the thermometer-coded output signal includes m output signals, and the binary output signal generated by the digital counter includes x output signals, and wherein the m output signals approximately equals $2^x$.

8. A system as in claim 2, wherein the second comparator receives said threshold values, and generates said a thermometer-coded output signals.

9. A system as in claim 8, wherein the second comparator comprises a plurality of logical units that generate said thermometer-coded output signal on a plurality of output signal lines.

10. A system as in claim 9, wherein the binary output signals are transmitted from said digital counter on a plurality of output lines, and wherein the number of output signal lines of said second comparator exceed the number of output lines of said digital counter.

11. A system as in claim 9, wherein each of said plurality of logical units has an associated output signal line, and wherein each logical unit generates an enable signal that is transmitted on the associated output signal line.

12. A system as in claim 11, wherein each of said plurality of logical units receives at least one of said threshold values from said first comparator, and in response generates a pair of enable signals.

13. A system as in claim 11, wherein said plurality of delay elements each comprise a transistor stack, and wherein each transistor stack is enabled by the enable signal from an associated output signal line of said second comparator.

14. A system as in claim 12, wherein each logical unit includes a high pass gate that generates one of said pair of enable signals, and a low pass gate which generates the other of said pair of enable signals.

15. A system as in claim 14, wherein said logical unit further includes combinatorial logic that combines together threshold values from said first comparator.

16. A system as in claim 8, wherein at least two of said threshold values are compared to generate said thermometer-coded output signal.

17. A method for synchronizing a clocked signal to a reference signal, comprising:
   detecting a difference in phase between the clocked signal and the reference signal;
   generating an output signal indicative of the phase difference between the clocked signal and the reference signal;
   changing the count value of a binary counter in response to the phase difference output signal;
   generating a binary count value signal, indicative of the count value in the binary counter, on a first plurality of output signal lines;
   converting the binary count value on said first plurality of output signal lines to a thermometer-coded signal on a second plurality of output signal lines; and
   enabling a delay line with said thermometer-coded signal to control the delay of said clocked signal;
   wherein converting the binary count value includes establishing a plurality of threshold values corresponding to said binary count value signal.

18. The method of claim 17, wherein the delay line comprises a plurality of delay elements, and wherein each of said second plurality of output signal lines enables one of said plurality of delay elements.

19. The method of claim 17, wherein the second plurality of output signal lines is greater in number than the first plurality of signal lines.

20. The method of claim 17, wherein the delay line comprises a plurality of transistor stacks connected in parallel, and wherein the transistor stacks are gated by said second plurality of output signal lines.

21. The method of claim 17, wherein the act of converting includes establishing a plurality of threshold values corresponding to said binary count value signal wherein the plurality of threshold values are selectively combined to generate the thermometer-coded signal on said second plurality of output signal lines.

22. A digital delay locked loop that controls the amount of delay to apply to a clocked signal to synchronize with a reference signal, comprising:
   a phase detector that determines a difference in phase between the clocked signal and the reference signal, and which generates an output signal that indicates if the clocked signal is ahead of or behind the reference signal;
   a binary counter that produces a binary output signal that indicates a desired delay for said clocked signal based on a count value produced in response to said output signal from said phase detector;
   comparator logic that establishes threshold values for said binary output signal, and which generates a plurality of enable output signals based on said threshold values; and
   a delay line that includes a plurality of transistor stacks arranged in parallel, and wherein each of said plurality of said enable signals controls one of said plurality of transistor stacks to thereby control the amount of delay given to said clocked signal.

23. A system as in claim 22, wherein the clocked signal produced by said delay line is applied to an input of the phase detector as the clocked signal.

24. A system as in claim 22, wherein the plurality of enable output signals are provided on a plurality of output signal lines between the comparator logic and the delay line.

25. A system as in claim 23, wherein the plurality of enable output signals are encoded on said plurality of output signal lines as a thermometer-coded signal.

26. A system as in claim 22, wherein the output signal generated by the phase detector includes an increment count signal and a decrement clock signal, depending on if the clocked signal lags or leads the reference clock signal.

27. A system as in claim 26, wherein the binary counter increases the count value in response to the increment count signal, and decreases its count value in response to the decrement clock signal.

28. A system as in claim 25, wherein the comparator logic comprises a plurality of logical units that generate said thermometer-coded output signal on a plurality of output signal lines.

29. A system as in claim 28, wherein each of said plurality of logical units has an associated output signal line, and wherein each logical unit generates an enable signal that is transmitted on the associated output signal line.

30. A system as in claim 29, wherein each of said plurality of logical units receives at least one threshold value, and in response generates a pair of enable signals.

31. A system as in claim 30, wherein each logical unit includes a high pass gate that generates one of said pair of enable signals, and a low pass gate which generates the other of said pair of enable signals.

32. A system as in claim 31, wherein said logical unit further includes combinatorial logic that combines together some of said threshold values.

* * * * *